United States Patent [19]

Campbell

[11] 4,360,928
[45] Nov. 23, 1982

[54] NON-INTERFERING ON-LINE RECEIVER TEST SYSTEM

[75] Inventor: Kenneth J. Campbell, Solana Beach, Calif.

[73] Assignee: The United States of America as represented by the Secretary of the Navy, Washington, D.C.

[21] Appl. No.: 459,523

[22] Filed: Apr. 10, 1974

[51] Int. Cl.³ .............................................. H04B 17/00
[52] U.S. Cl. .................................. 455/226; 324/57 N
[58] Field of Search ............... 325/67, 363; 324/57 N; 455/67, 226

[56] References Cited

U.S. PATENT DOCUMENTS 3,736,512  5/1973  Gowan .................................. 325/363

Primary Examiner—Marc E. Bookbinder
Attorney, Agent, or Firm—Richard S. Sciascia; Ervin F. Johnston; Thomas M. Phillips

[57] ABSTRACT

An on-line noise figure measurement system for receivers that produces valid results whether or not signals are being received. A narrow pulse having a low pulse repetition frequency and low amplitude is injected into the receiver. A processing circuit cyclically measures the output of the RF stage of the receiver to produce a ratio of two signal values. One value is measured in the absence of any signal entering the receiver while the other value is measured with only the pulse signal impressed on the receiver.

5 Claims, 2 Drawing Figures

NON-INTERFERING ON-LINE RECEIVER TEST SYSTEM

BACKGROUND OF THE INVENTION

The present invention relates to non-interfering on-line receiver testing and more particularly to non-interfering on-line receiver testing for receivers that have broad band RF amplifier stages and narrow band IF/AF amplifier stages. There are no known on-line noise figure measurement systems which yield valid results while signals are being received by the receiver under test.

SUMMARY OF THE INVENTION

The present invention provides a means of testing receivers without interference to normal receiver operation which yields valid results even when signals are being received. A sequential switching arrangement is provided so that the output of the RF amplifier stage may be measured with no signal source applied to the receiver input and with pulse of known characteristics applied to the receiver input. A ratio of the two measured values is subsequently obtained to provide a signal that is proportional to the receiver noise figure.

OBJECTS OF THE INVENTION

Accordingly an object of the invention is the provision of a means of testing receivers without interfering with normal receiver operation which yields valid results even when signals are being received by the receiver under test.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
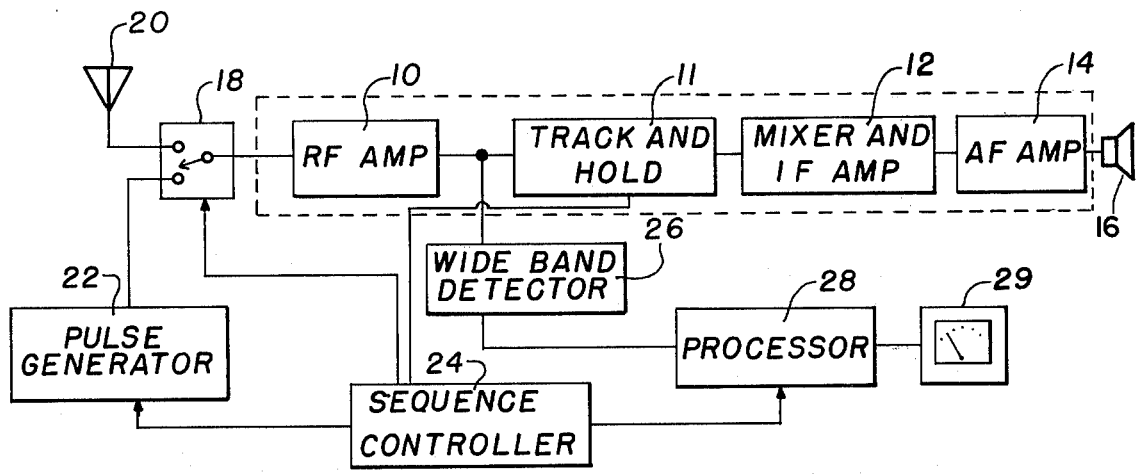
FIG. 1 is a block diagram of a preferred embodiment of the invention.

Referring now to FIG. 1 wherein there is shown a receiver including an RF amplifier stage 10, mixer and IF amplifier stage 12 and audio amplifier stage 14. The output of RF amplifier 10 is coupled through a track and hold circuit 11 to the mixer and IF amplifier 12. The output of audio amplifier stage 14 is fed to a speaker 16. The input to the receiver and RF amplifier stage 10 is connected by means of a switch 18 to the receiving antenna 20. A pulse generator 22 is connected to switch 18. Switch 18 and pulse generator 22 are controlled by a sequence controller 24. The output of RF amplifier 10 is coupled through a wide band detector 26 to a processing circuit 28. Since a very narrow pulse with a low pulse repetition frequency has a spectrum envelope which approaches being flat and spectrum content which approaches being continuous, a narrow pulse injected into a receiver, will be amplified as though it were a signal whose frequency was equal to the receiver frequency, also it is known that the bandwidth of a receiver is directly related to how fast the receiver will be able to respond to the injected pulse. Since the RF section of a typical receiver has a bandwidth several hundred times greater than the IF section it is possible to inject a low level pulse into the input of a receiver and observe the pulse at the output of the RF section in a very short time. During this short period of time the mixer and IF amplifier are decoupled from the RF amplifier by means of the track and hold circuitry thus no pulse energy is allowed to pass to the output of the receiver. Also because the IF and AF sections of the receiver are of much narrower bandwidth, they are unable to respond to the fast input signal changes. Thus there will be no interference with normal receiver operation.

Figure 2:
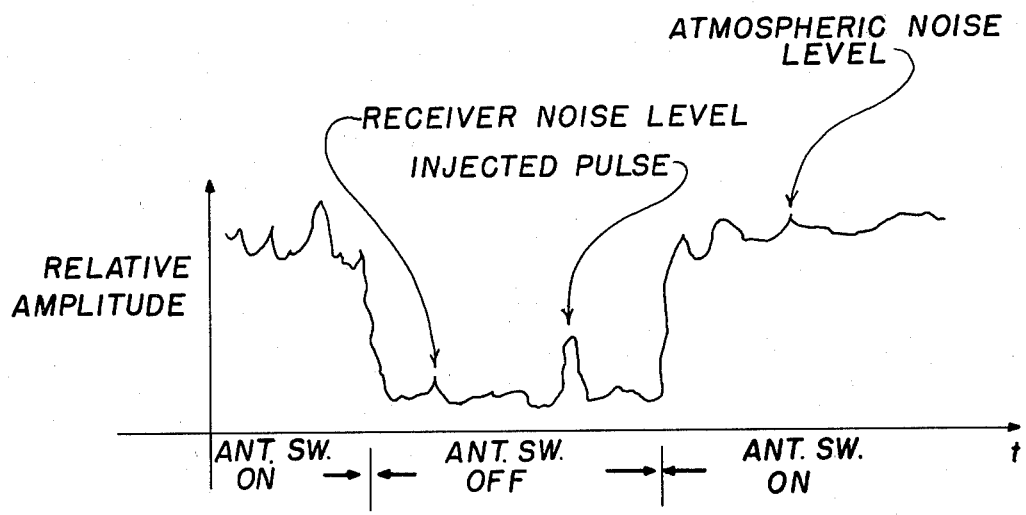
FIG. 2 is a graph of typical waveforms that can be observed in practicing the invention.

Normally, the receiver is connected to antenna 20 by means of antenna switch 18, and track and hold circitry 11 is in the track mode. When the test is to be performed sequence controller 24 causes switch 18 to switch from antenna 20 to pulse generator 22 and track and hold circuitry 11 is caused to go into the hold mode. Processor 28 is caused by sequence controller 24 to sample the output level of RF amplifier 10 (shown in the "antenna switch off" portion of the waveform of FIG. 2.) This is a measure ($V_1$) of receiver produced noise power. Controller 24 then causes pulse generator 22 to output a pulse. The output level of RF amplifier 10 is again sampled by processor 28. This is a measure ($V_2$) of the receiver produced noise power plus the known injected pulse signal power (see injected pulse portion of the waveform of FIG. 2). Antenna switch 18 is then caused to return to its normal antenna position and track and hold circuitry 11 is caused to go back into its normal track mode. Processor 28 then computes the ratio $V_2/V_1$ and averages it with previous samples to provide an output signal to display means or meter 29. The running average is a measure of the receiver noise figure. The sequence of events should be programmed to be performed fast enough so that the narrow band (thus slow responding) IF section 12 will not be able to respond to the fast low level pulse.

In practicing the invention, a receiver with a 20 MHz bandwidth could be cycled in 250 ns by injecting a pulse having a PRF of about one Hz. The amplitude of the injected pulse should have an amplitude sufficient to maintain an approximate ratio of $V_2/V_1$ at about two to one. Wide band detector 26 should have a bandwidth as wide as the RF stage bandwidth.

Obviously many modifications and variations of the present invention are possible in the light of the above teachings. It is therefore to be understood that within the scope of the appended claims the invention may be practiced otherwise than as specifically described.

What is claimed is:

1. A system for providing noise figure testing of receivers without interfering with their normal operation and providing valid results while signals are being received, the combination comprising:
    (a) a receiver including a receiving antenna, an RF amplifier, a mixer and IF amplifier stage and having a track and hold circuit connecting the output of said RF amplifier to the input of said mixer and IF amplifier stage;
    (b) signal detecting means coupled to the output of the RF stage of said receiver;
    (c) pulse signal generating means;
    (d) switching means for coupling said receiver to said receiving antenna and to said pulse generator;
    (e) sequence controller means coupled to said pulse generating means, to said switching means and to said track and hold circuit means, said sequence controller means sequentially disconnecting the antenna from said receiver and connecting said pulse signal generating means to said receiver so that signals of two different values will be detected by said detecting means;

(f) and processing circuit means coupled to said sequence controller and to said detecting means for providing an output signal in response to the two detected values that is proportional to the noise figure of the receiver.

2. The system of claim 1 wherein said track and hold circuit means operates in the track mode to couple the output of the RF stage to the mixer and IF stage of said receiver and operates in the hold mode to decouple the RF stage from the mixer and IF stage of said receiver when said pulse generator is connected to said receiver.

3. The system of claim 1 wherein said pulse signal generating means provides a narrow, low PRF pulse of low amplitude.

4. The system of claim 3 wherein the PRF of the generated pulse is approximately one Hz.

5. The system of claim 3 wherein the amplitude of the generated pulse is of an amplitude to cause the ratio of receiver produced noise power plus the power of the generated pulse to receive noise power alone to be two to one.

* * * * *